(12) United States Patent
Henzler et al.

(10) Patent No.: US 8,994,573 B2
(45) Date of Patent: Mar. 31, 2015

(54) DIGITAL-TO-TIME CONVERTER AND CALIBRATION OF DIGITAL-TO-TIME CONVERTER

(71) Applicant: Intel Mobile Communications GmbH, Neubiberg (DE)

(72) Inventors: Stephan Henzler, Munich (DE); Markus Schimper, Moosinning (DE)

(73) Assignee: Intel Mobile Communications GmbH, Neubiberg (DE)

( * ) Notice: Subject to any disclaimer, the term of this patent is extended or adjusted under 35 U.S.C. 154(b) by 204 days.

(21) Appl. No.: 13/833,256

(22) Filed: Mar. 15, 2013

(65) Prior Publication Data

US 2014/0266822 A1    Sep. 18, 2014

(51) Int. Cl.
*H03M 1/82*    (2006.01)

(52) U.S. Cl.
CPC ..................................... *H03M 1/82* (2013.01)
USPC .......................................... 341/166; 341/144

(58) Field of Classification Search
CPC ........... H03M 1/82; H03K 5/14; H03K 5/131; H03K 5/133
USPC ................................................... 341/144, 166
See application file for complete search history.

(56) References Cited

U.S. PATENT DOCUMENTS

| 7,409,416 | B2 | 8/2008 | Stengel |
| 8,462,840 | B2 * | 6/2013 | Chen et al. .................... 375/239 |
| 8,860,514 | B2 * | 10/2014 | Weltin-Wu et al. ............. 331/74 |

* cited by examiner

*Primary Examiner* — Khai M Nguyen
(74) *Attorney, Agent, or Firm* — Eschweiler & Associates, LLC

(57) ABSTRACT

A digital-to-time converter (DTC) comprises a gate controller configured to generate a gate enable signal based on first and second digital values so that the gate enable signal has a first enable period and a second enable period for each pair of a first digital value and a second digital value. A gate conditionally passes a main clock signal to a gate output in response to the gate enable signal, the gate thus providing a gated signal at a gate output. A frequency divider generates a frequency divided signal as the output signal of the digital-to-time converter based on the gated signal. The DTC may be calibrated by a time-to-digital converter connected between an input for the main clock signal and an output of a delay element of the DTC.

15 Claims, 17 Drawing Sheets

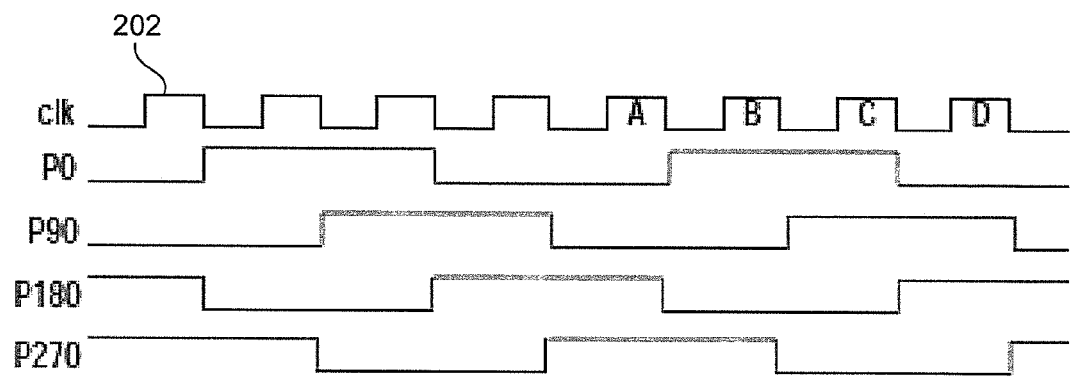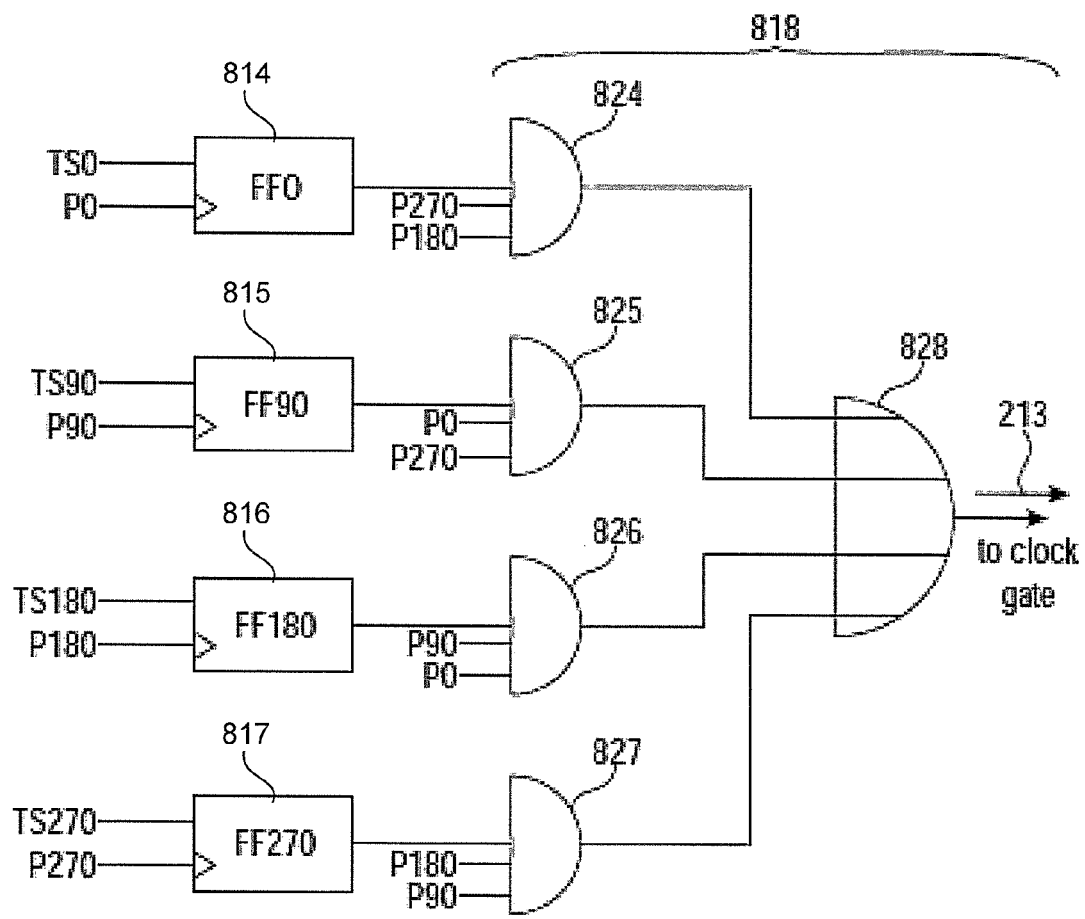
FIG 9

DIGITAL-TO-TIME CONVERTER AND CALIBRATION OF DIGITAL-TO-TIME CONVERTER

BACKGROUND

In mobile communication devices, digital-to-time converters (DTCs) are promising building blocks, for example, for phase modulators. A DTC is a building block which delays incoming signal edges according to digital tuning information at its input. In a phase modulator the DTC acts as a variable delay element which alters the phase of an incoming quasi periodic signal by dynamically changing its delay. For example, a DTC may be used as a component of a phase path of a polar transmitter of a mobile communication device.

SUMMARY

A digital-to-time converter comprises a gate controller configured to generate a gate enable signal based on first and second digital values so that the gate enable signal has a first enable period and a second enable period for each pair of a first digital value and a second digital value. A gate conditionally passes a main clock signal to a gate output in response to the gate enable signal, the gate thus providing a gated signal at a gate output. A frequency divider generates a frequency divided signal as the output signal of the digital-to-time converter based on the gated signal.

BRIEF DESCRIPTION OF THE DRAWINGS

FIG. 9 schematically illustrates several exemplary waveforms and an exemplary logic circuit of the time-interleaved enable signal generator;

DETAILED DESCRIPTION

Figure 1:
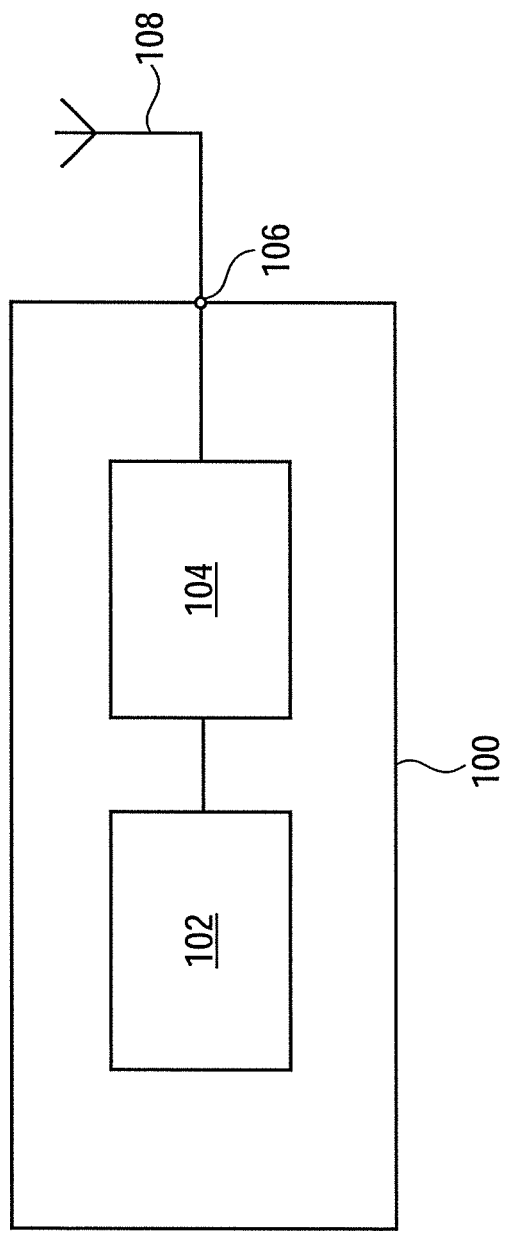
FIG. 1 shows a block diagram of an exemplary mobile communication device.

FIG. 1 shows a block diagram of an exemplary mobile communication device 100 comprising a digital baseband processor 102, an RF front end 104 coupled to the baseband processor 102 and to an antenna port 106. The antenna port 106 is provided to allow connection of an antenna 108 to the mobile communication device 100. The baseband processor 102 generates signals to be transmitted via the antenna 108 which are forwarded to the RF front end 104 generating a transmit signal output to the antenna port 106 for transmission via the antenna 108. The RF front end 104 may also receive signals via the antenna port 106 from the antenna 108 and provides respective signals to the baseband processor 102 for processing the received signals. The apparatus and the method described in further detail in the following may be implemented in the baseband processor 102, for example in a processor operating on data signals for generating the respective input signals to the RF front end 104, and/or in the RF front end 104, like in a polar transmitter used for generating the transmit signal output at antenna port 106 based on inputs signals received from the baseband processor.

The mobile communication device 100 may be a portable mobile communication device and may be configured to perform a voice and/or data communication according to a mobile communication standard with other communication devices, like other mobile communication devices or base stations of a mobile communication network. Mobile communication devices may comprise a mobile handset, such as a mobile phone or a smart phone, a tablet PC, a broadband modem, a laptop, a notebook, a router, a switch, a repeater or a PC. Also, the mobile communication device 100 may be a base station of a communication network.

The RF front end 104 may comprise a transmitter and a receiver. The transmitter of the RF front end 104 may be a polar transmitter in which an amplitude and a phase of a signal to be transmitted (transmit signal) are processed separately. The phase processing path of the polar transmitter may comprise a phase modulator.

In a phase modulator it may be desirable to provide a high frequency output frequency where the position of the rising and falling edges is set according to a phase modulation information provided to an input of the phase modulator. The phase modulator may be implemented as a digital-to-time converter, or the phase modulator may comprise a digital-to-time converter. A property that is typically desired for a digital-to-time converter or phase modulator is that it is strictly monotonic. Furthermore, the delay-over-tuning characteristic of the DTC should be continuous, i.e., the delay caused by the DTC should not exhibit unusually large jumps between two adjacent digital tuning values.

Figure 2:
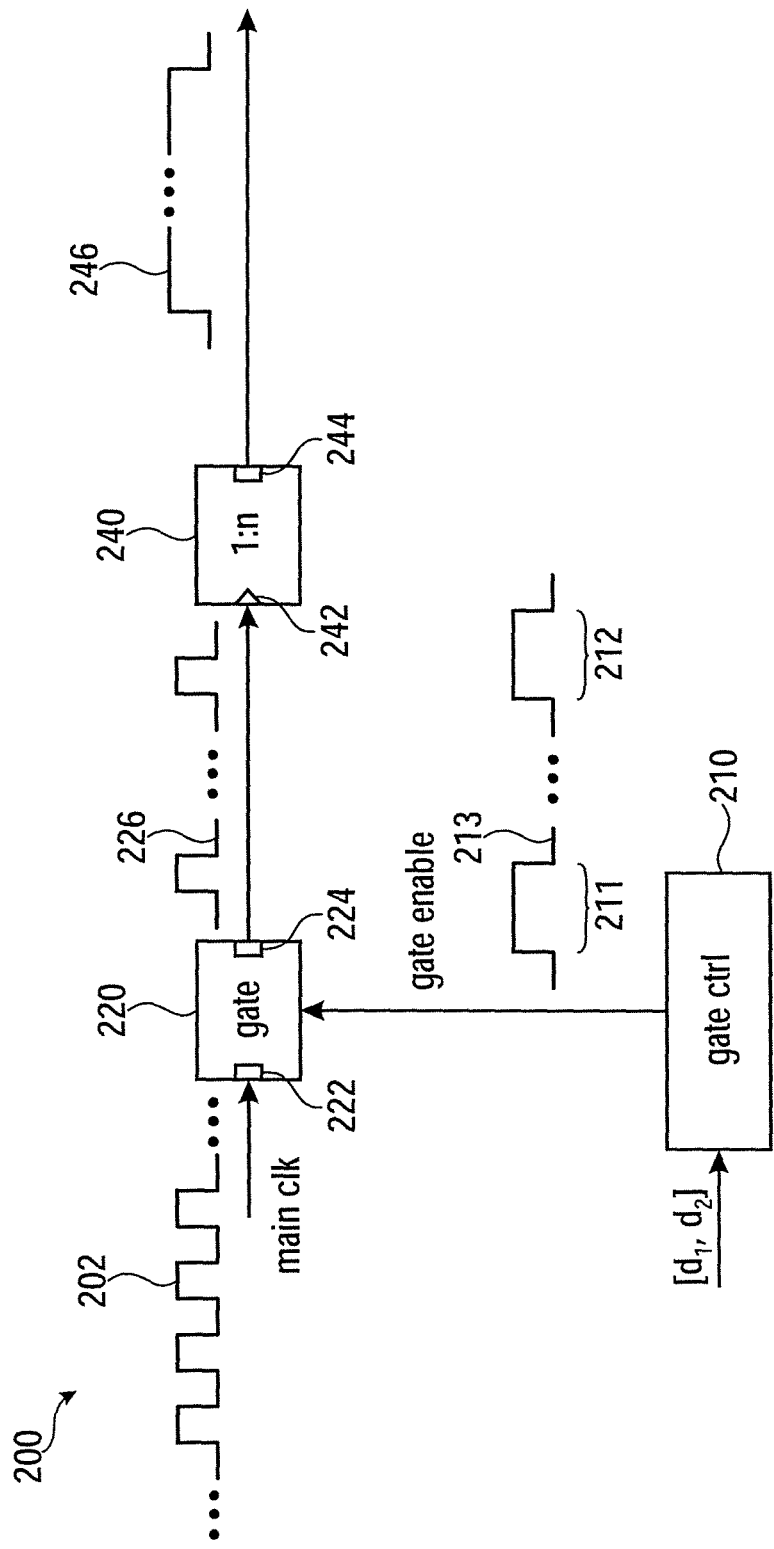
FIG. 2 shows a schematic block diagram of a digital-to-time converter comprising a gate and a frequency divider.

FIG. 2 shows a schematic block diagram of an exemplary digital-to-time converter 200. The digital-to-time converter 200 comprises a gate controller 210 configured to receive at least a portion of a first digital value $d_1$ and at least a portion of a second digital $d_2$. The portions of the first and second digital values $d_1$, $d_2$ may be, for example, the most significant portions, i.e. one or more most significant bit(s) (MSB) of the digital values $d_1$, $d_2$ indicative of a coarse portion of the delay to be provided by the DTC 200. The first digital value $d_1$ and the second digital value $d_2$ (or the corresponding portion) are provided as an input to the DTC 200 and are intended to be converted to time instants of a rising edge and a falling edge, respectively, of an output signal of the digital-to-time converter 200. The gate controller 210 is configured to generate a gate enable signal 213 based on at least the portions of the first and second digital values $d_1$, $d_2$ so that the gate enable signal has a first enable period 211 and a second enable period 212 for each pair [$d_1$, $d_2$] of the first digital value and the second digital value.

The DTC 200 further comprises a gate 220 configured to conditionally pass a main clock (main clk) signal 202 applied at a gate input 222 to a gate output 224 in response to the gate enable signal 213. The gate 220 thus provides a gated signal 226 at the gate output 224. An input 242 of a frequency divider 240 is connected to the gate output 224 and configured to generate a frequency divided signal 246 available at a frequency divider output 244. The frequency divided signal 246 may be used as the output signal of the digital-to-time converter 200. Alternatively, the frequency divided signal may be further processed to obtain the output signal of the DTC 200.

The input 242 of the frequency divider 240 may be edge-triggered and the frequency divider 240 may toggle between a first logic state and a second logic state each time an edge of a particular polarity (rising or falling edge) is applied to the input 242. For example, the frequency divider 240 reacts to rising edges, only, and ignores any falling edges (or vice versa). This avoids that timing mismatches between the processing of rising edges and of falling edges affect the timing precision of the frequency divided signal 246.

The gate controller 210 may be configured such that exactly one pulse of the main clock is passed during each enable period. In an alternative implementation the gate controller may be configured such that a predefined number of pulses of the main clock is passed during each enable period. In this case the frequency divider 240 may divide by a divider factor larger than 2. The multiple clock pulses corresponding to each of the first digital value d1 and second digital value d2 may be used for calibration of the digital-to-time converter.

Figure 3A:
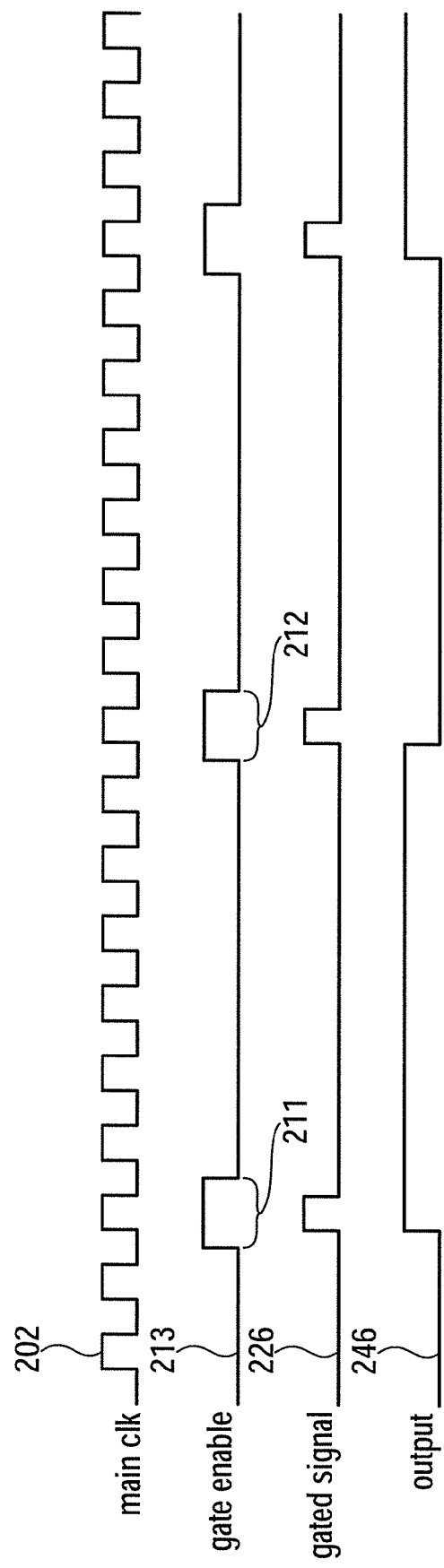
FIG. 3A schematically illustrates exemplary waveforms of a main clock signal, a gate enable signal, a gated signal having a single pulse per gate enable period, and a frequency divided signal.

FIG. 3A schematically illustrates exemplary waveforms of the main clock signal 202, the gate enable signal 213, the gated signal 226, and the frequency divided signal 246. It can be seen that the first digital value $d_1$ results in the first enable period 211 of the gate enable signal 213 and the second digital value $d_2$ results in the second enable period 212. Accordingly, the gated signal 226 comprises a first pulse for the first enable period and a second pulse for the second enable period. The first pulse in the gated signal 226 causes the frequency divider 240 to change its output 246 from a logic low state to a logic high state, i.e. a rising edge. The second pulse in the gated signal 226 causes the frequency divider 240 to change its output 246 from the logic high state back to the logic low state, i.e. a falling edge. In the example shown in FIGS. 2 and 3, the frequency divider is a 1:2 frequency divider so that a frequency of the frequency divided signal 246 is half the frequency of the gated signal 226. To indicate which enable period should cause a rising or falling output signal, respectively, an optional control signal from the gate controller 210 can be forwarded to the divider 240.

Figure 3B:
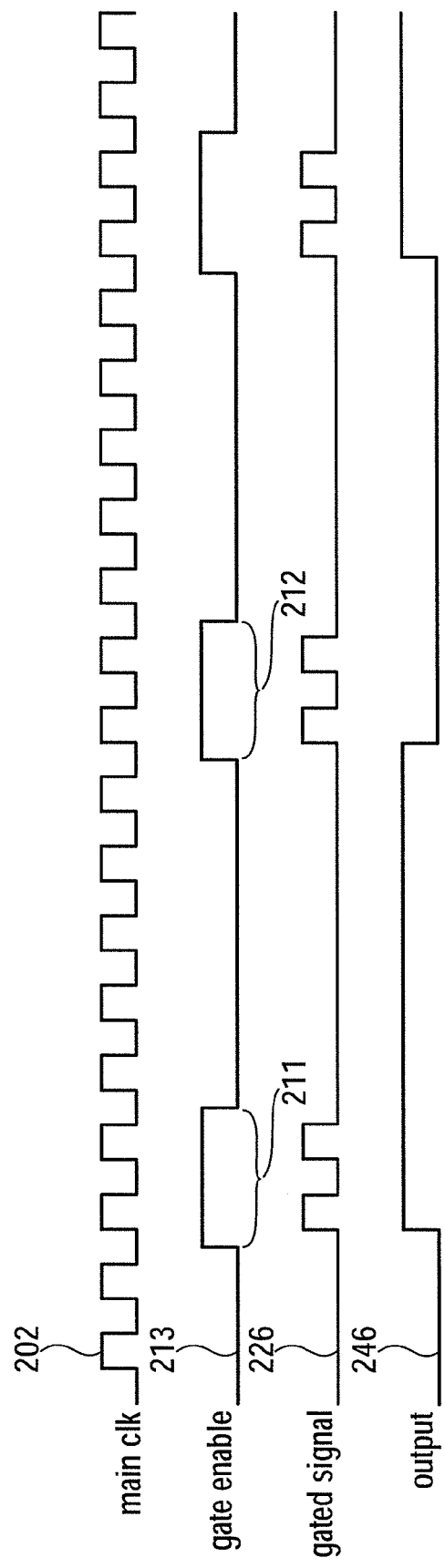
FIG. 3B schematically illustrates exemplary waveforms of a main clock signal, a gate enable signal, a gated signal having a double pulse per gate enable period, and a frequency divided signal.

FIG. 3B schematically illustrates exemplary waveforms for the above mentioned alternative implementation according to which the gate controller is configured such that a predefined number of pulses (here: two pulses) of the main clock is passed during each enable period. The final output signal 246 may then be obtained by frequency dividing the gated signal 226 by a divider factor larger than 2. In the illustrated case of FIG. 3B, the divider factor is 4.

The main signal path extends between the input 222 of the gate 220 and the output 244 of the frequency divider 240. Thus, a relatively low number of components (circuit blocks) are provided within the main signal path. Due to the relatively low number of components in the main signal path, a high signal quality can be maintained, i.e., the signal quality is not (or at least only to a small extent) degraded due to component variations and/or noise. With the exemplary DTC shown in FIG. 2 and also in some of the subsequent Figures, many circuit blocks are pushed out of the phase-noise and matching critical signal path, when comparing the structure of the exemplary DTC 200 in FIG. 2 with other implementations of digital-to-time converters (e.g., implementations that comprise a plurality of chained delay elements and a multiplexer for selecting an output of one of the chained delay elements). Therewith, the design of these circuit blocks, which are no longer necessarily within the phase-noise and matching critical path, is not constrained by local variations/matching and noise.

Figure 4A:
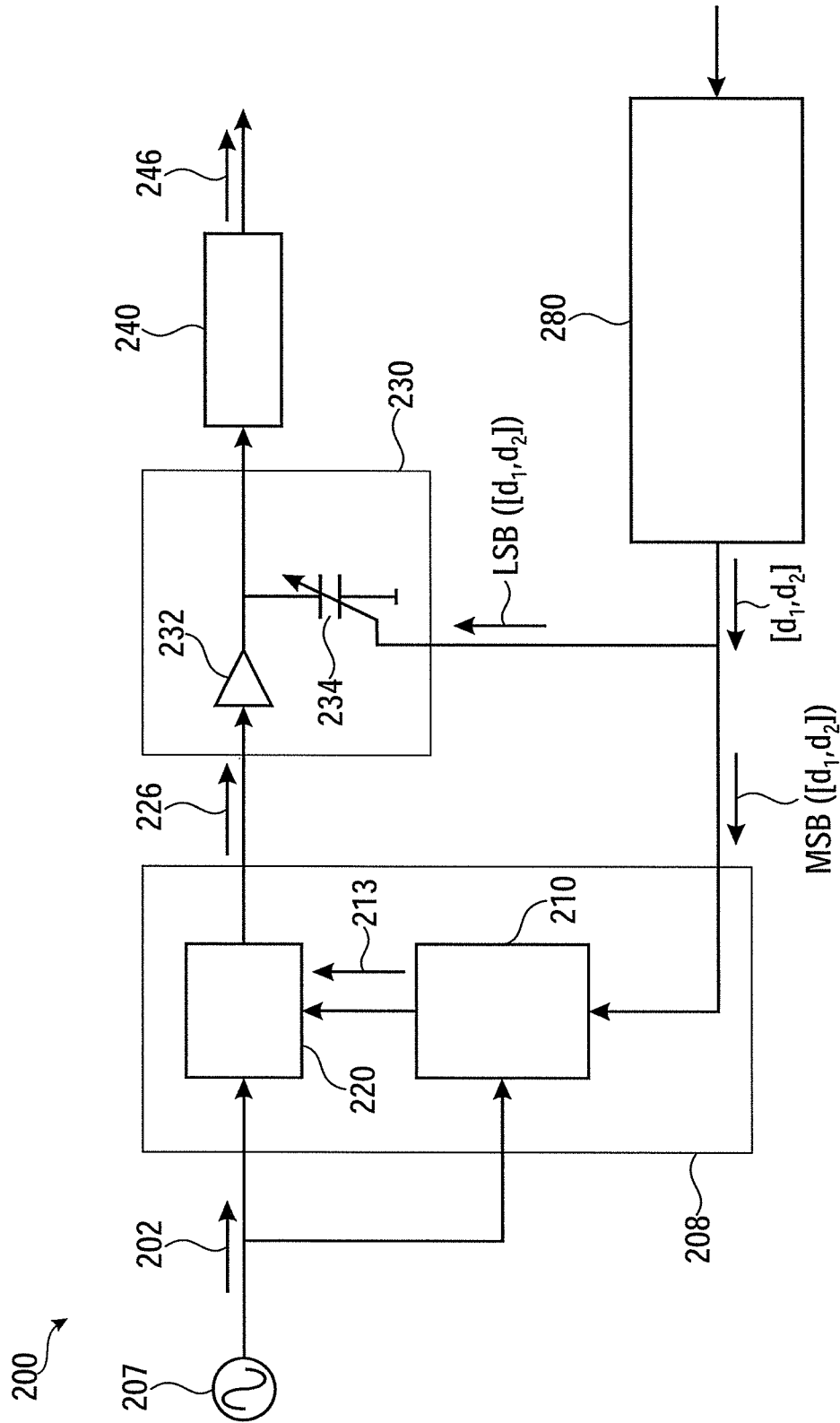
FIG. 4A shows a schematic block diagram of another exemplary digital-to-time converter.

FIG. 4A shows a schematic block diagram of another exemplary digital-to-time converter 200. The operation of the DTC 200 may be explained as follows: a high frequency signal (main clock signal 202) is used as input signal to the phase modulator/digital-to-time converter 200. High frequency means that the frequency should be much higher than the target signal frequency. For cellular applications a 16 GHz frequency is a reasonable example for current technology nodes. The high frequency signal (main clock signal) 202 may be provided by an oscillator 207.

A programmable pulse selector 208 swallows most of the high frequency clock cycles. The programmable pulse selector 208 comprises the gate controller 210 and the gate 220. Only at the position where the output signal should have a rising or falling edge a pulse or set of pulses is passed by the gate 220. The programmable pulse selector 208 swallows most of the high frequency clock cycles. In other words the position of a rising or falling edge of the signal to be generated is (coarsely) indicated by a pulse. The pulse position is derived from the phase modulation information which is provided via an input of the digital-to-time converter 200 and which is typically changing in every clock cycle of the phase modulated output signal. The programmable pulse selector 208 thus acts as a coarse phase modulator.

Of course the pulse position suffers from a quantization error according to the period of the high frequency signal. Only a single edge type (either rising or falling edge) of the RF signal 202 is used. This avoids any noise contribution and potential phase mismatch from dividers or delay chains. The programmable pulse selector 208 comprises the clock gate 220 and the gate controller 210.

The programmable pulse selector 208 comprises a clock gating element 220 and a high-speed logic block 210 which translates the coarse phase modulation information into an enable signal 213 for the clock gating element 220. Only the clock gating element 220 is inside the signal path so may contribute phase noise. The high-speed logic 210, however, is located parallel to the signal paths and changes the enable signal 213 only while there is no switching activity in the clock gating element 220. Therefore, it contributes neither noise nor mismatch and can be designed very efficiently according to high speed logic design methodology. In particular the high speed logic does not need to be extensively designed for noise performance (power saving).

The programmable pulse selector 208 is programmed by a most significant part of the phase modulation input signal (MSB([$d_1$, $d_2$])). The coarsely quantized output signal (gated signal 226) of the programmable pulse selector 208 is fed to a fine phase modulation circuit 230. This fine phase modulation circuit 230 delays the incoming pulses according to a least significant part of the phase modulation information (LSB([$d_1$, $d_2$])). After the fine phase modulation block 230 there is a pulse sequence with a pulse repetition rate twice as high as the output frequency. The pulse position, in particular the rising edge of the pulse, is very accurately modulated according to the phase modulation input.

The fine delay element 230 comprises in the illustrated example a buffer amplifier 232 and a tunable capacitance 234. The tunable capacitance 234 is controlled by a least significant portion (LSB) of the first and second digital values $d_1$ and $d_2$. The least significant portion comprises the one or more least significant bit(s) of the first and second digital values $d_1$, $d_2$. In a similar manner, the most significant portions (MSBs) of $d_1$ and $d_2$ are provided to the programmable pulse selector 208. The tunable capacitance 234 may be implemented as a capacitance array.

The fine delay element 230 comprises in another example a tunable interpolation element. In this case it is advantageous if the gating element passes two pulses of the main clock in response to the enable period. The fine delay element, i.e. the interpolation element, then interpolates in between the two clock pulses and generates a single pulse with edges in between the corresponding edges of the two gated pulses of the main clock.

In a last step frequency divider 240 (e.g., a flip-flop in a divide-by-two configuration) is used to translate a set of pulses, e.g. two pulses into a rising and a falling edge of the output signal 246. The divider 240 may be clocked by the pulses of the gated signal 226 described above, i.e. at the position of the pulses a rising or falling edge is generated, respectively.

The phase modulation information is usually provided with a constant rate, often a lower rate, given by an external clock. Inside the phase modulator 200, however, the phase modulation information is updated in response to the phase modulated output signal 246, i.e. with a varying rate. Thus, a synchronization circuit 280, e.g. a variable sample rate converter, may be used to at the interface of the phase modulator 200 at which the pairs of digital values [$d_1$, $d_2$] are received. The sample rate converter may be a fractional sample rate converter. It may also comprise interpolation (linear, cubic, spline, etc.) of the input data.

The technique of using the gate 220 for conditionally passing a pulse of the main clock signal 202 in response to the gate enable signal 213 can have the following properties in some implementations:
- The dynamic range of the fine tuning element may be relatively small due to the high frequency of the input signal, i.e., the fine delay element 230 interpolates between one high frequency cycle. This fact may be exploited by using an area and/or power efficient implementation, possibly having a small mismatch.
- There is no discontinuity, i.e. no delay elements are inserted or removed from the signal path, and no phases are switched.
- By construction, the programmable pulse selector 208 cannot cause any non-linearity or variation effects
- Only the rising edge (alternatively: only the falling edge) of the pulse carries the relevant pulse position information, i.e. there is no need to have a well matched delay for rising and falling transition. This simplifies the capacitance array 234 considerably.
- Most of the circuitry such as the high speed logic/gate controller 210 is outside the noise critical signal path.
- Coarse/fine architecture without the use of multiple phases
- Time domain multiplexer instead of multiplexer of multiple phases
- Processing of rising edges only (no rise/fall mismatch)
- Small dynamic range of fine stage (no switching of elements, thus no mismatch issues for monotonicity)
- Intrinsically monotonic
- Minimum number of circuit blocks and gates within signal path, selection logic completely outside the signal path→no impact of these elements on noise and variability
- Gain of coarse stage is perfectly known In case a differential output signal is required a fully symmetrical flip-flop such as a sense amplifier based flip-flop can be used as the divider 240. Nevertheless, the full DTC signal path may still be single ended and only in the divider 240 differential signals are generated, which typically results in reduced power, reduced area, and improved matching.

Figure 4B:
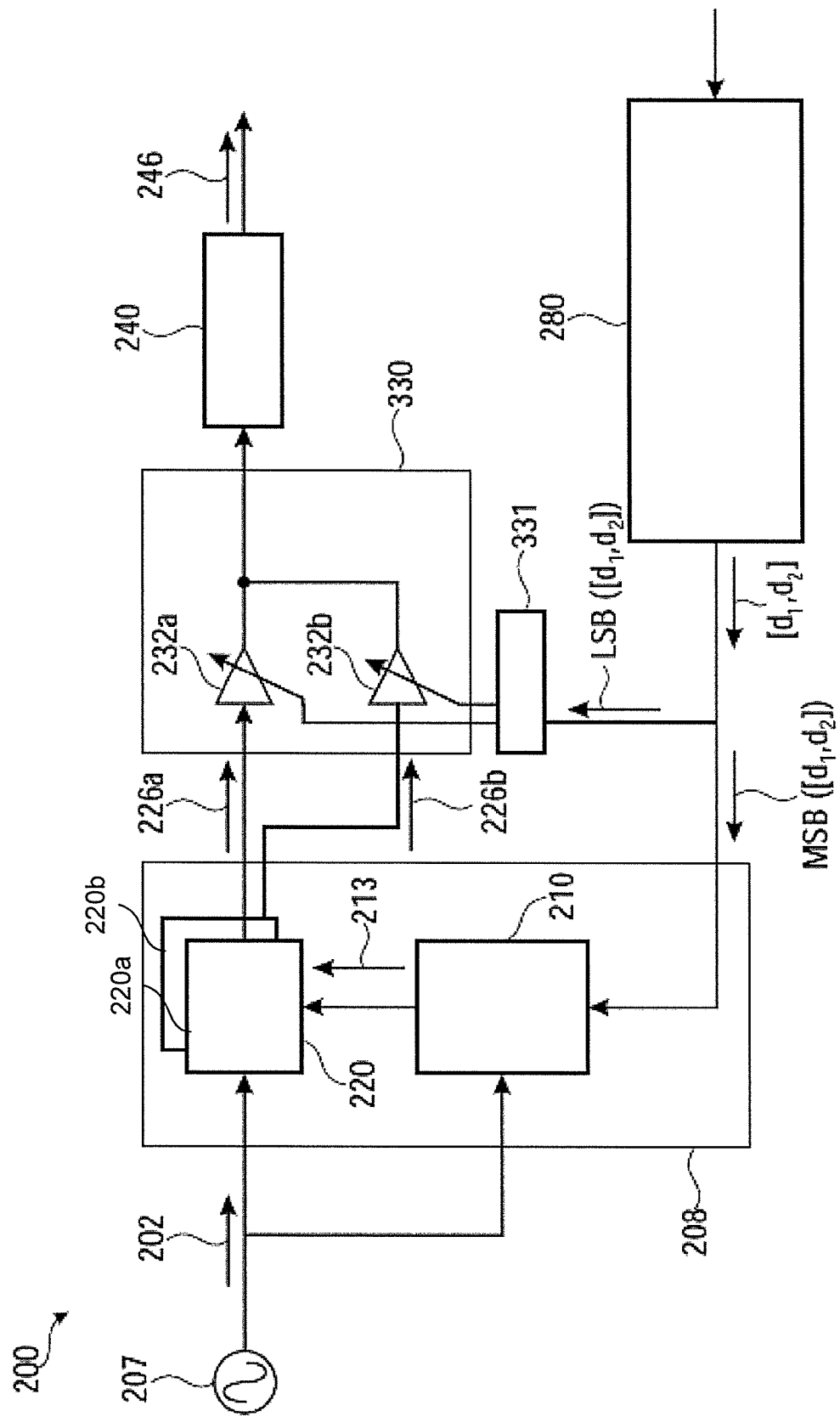
FIG. 4B shows a schematic block diagram of an exemplary digital-to-time converter comprising two gating elements and a pulse splitter.

FIG. 4B shows a schematic block diagram of a digital-to-time converter 200 comprising two gating elements 220a, 220b. Alternatively, the digital-to-time converter 200 may comprise the single gate 220 of the exemplary DTC 200 in FIG. 4A and an additional pulse splitter downstream of the gate 220. Furthermore, the DTC 200 comprises an interpolator 330 comprising a first fine delay element and a second fine delay element. The first fine delay element comprises a buffer amplifier 232a and is configured to process the pulses of the gated signal 226a output by the first gating element 220a. The second fine delay element comprises a buffer amplifier 232b and is configured to process the gated signal 226b output by the second gating element 220b. In the alternative implementation comprising a single gate 220 and a downstream pulse splitter, the first fine delay element may be connected to a first output of the pulse splitter and the second fine delay element may be connected to a second output of the pulse splitter. The interpolator 330 may be configured to interpolate in between the two clock pulses and to generate a single pulse with edges in between the corresponding edges of the two gated pulses of the main clock. The least significant part of the phase modulation information (LSB([$d_1$, $d_2$])) may be adjusted individually and separately for the first fine delay element and the second fine delay element by a circuit 331.

Figure 5:
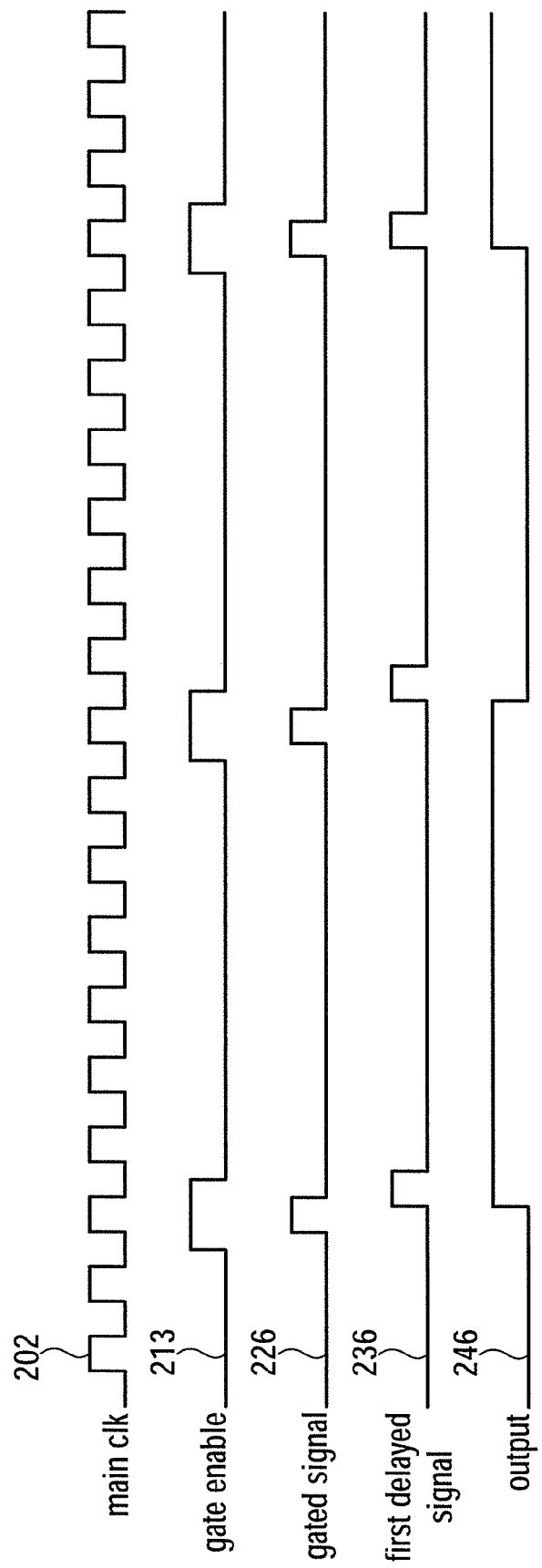
FIG. 5 shows exemplary waveforms for the DTC schematically shown in FIG. 4A.

FIG. 5 shows exemplary waveforms for the DTC 200 schematically shown in FIG. 4A. In addition to the waveforms shown in FIG. 3A, FIG. 5 also shows the fine delayed signal 236. Each pulse within the fine delayed signal 236 is delayed with respect to a corresponding pulse in the gated signal 226 by an individual fine delay value. The pulse-individual fine delay values are a function of the least significant portions of the first and second digital values $d_1$, $d_2$.

An exemplary digital-to-time converter 200 may comprise four main building blocks which are cascaded: (1) a high frequency oscillator (RF clock) 207 with a frequency of N times the average output frequency; (2) a coarse phase modulation block comprising a programmable pulse selector 208; (3) a fine phase modulation block 230; and (4) a frequency reduction circuit 240 (e.g. flip-flop as divider) translating two subsequent rising (alternatively falling) edges of high frequency pulses into a rising and a falling edge of an output signal.

A phase modulation input which describes the instantaneous phase of the output signal is split into a most significant part MSB($d_1$) and a least significant part LSB($d_1$).

The most significant part is fed to the programmable pulse selector 208 and the least significant part is fed to the fine phase modulation block 230. A synchronization circuit 280 is advantageous for fixed sample rate conversion, variable sample rate conversion, fractional sample rate conversion, interpolation, or a combination of the aforementioned synchronization methods.

Preferably, the update rate of the programmable pulse selector and the fine phase modulation block is larger or equal to desired output frequency.

The programmable pulse selector 208 comprises a clock gating element 220 and a high-speed logic 210 which translates the coarse phase modulation information MSB($d_1$) into an enable signal 213 for the clock gate 220. This enable signal 213 changes during the low phase of the high frequency clock signal 202 only (more generally: only during inter-pulse gaps of the high frequency clock signal). Therewith, it is valid before the next rising edge of the high frequency clock signal 202 which makes the generation of the pulse gating signal uncritical with respect to phase noise.

Only edges of the same polarity (rising or falling) are processed, i.e. only edges of the same polarity are performance critical. In this manner, no separate circuits for rising and falling signal edges are needed which makes the DTC more robust against variations of its components.

Figure 6:
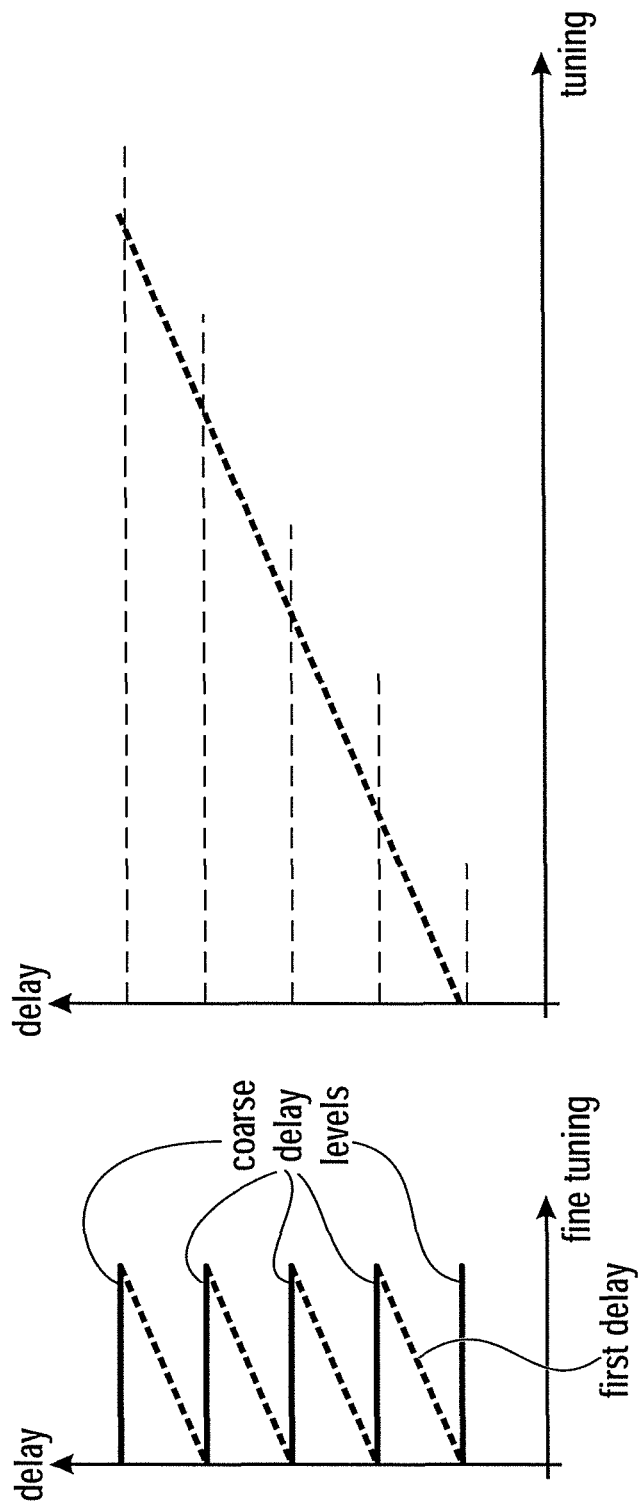
FIG. 6 schematically illustrates a combination of a coarse delay and a fine delay.

FIG. 6 schematically illustrates how the coarse delay provided by the programmable pulse selector 208 and the fine delay provided by the fine phase modulation block 230 are combined to form the total delay/phase modulation of the DTC 200. The fine delay interpolates between two adjacent coarse delay levels. The coarse delay levels matched to each other with a high precision, since the coarse delay levels correspond to successive pulses of the highly precise main clock signal 202. Note that all pulses of the main clock signal 202 are generated using the same oscillator so that any variation of the oscillator 207 affects all coarse delay levels in the same manner.

Figure 7:
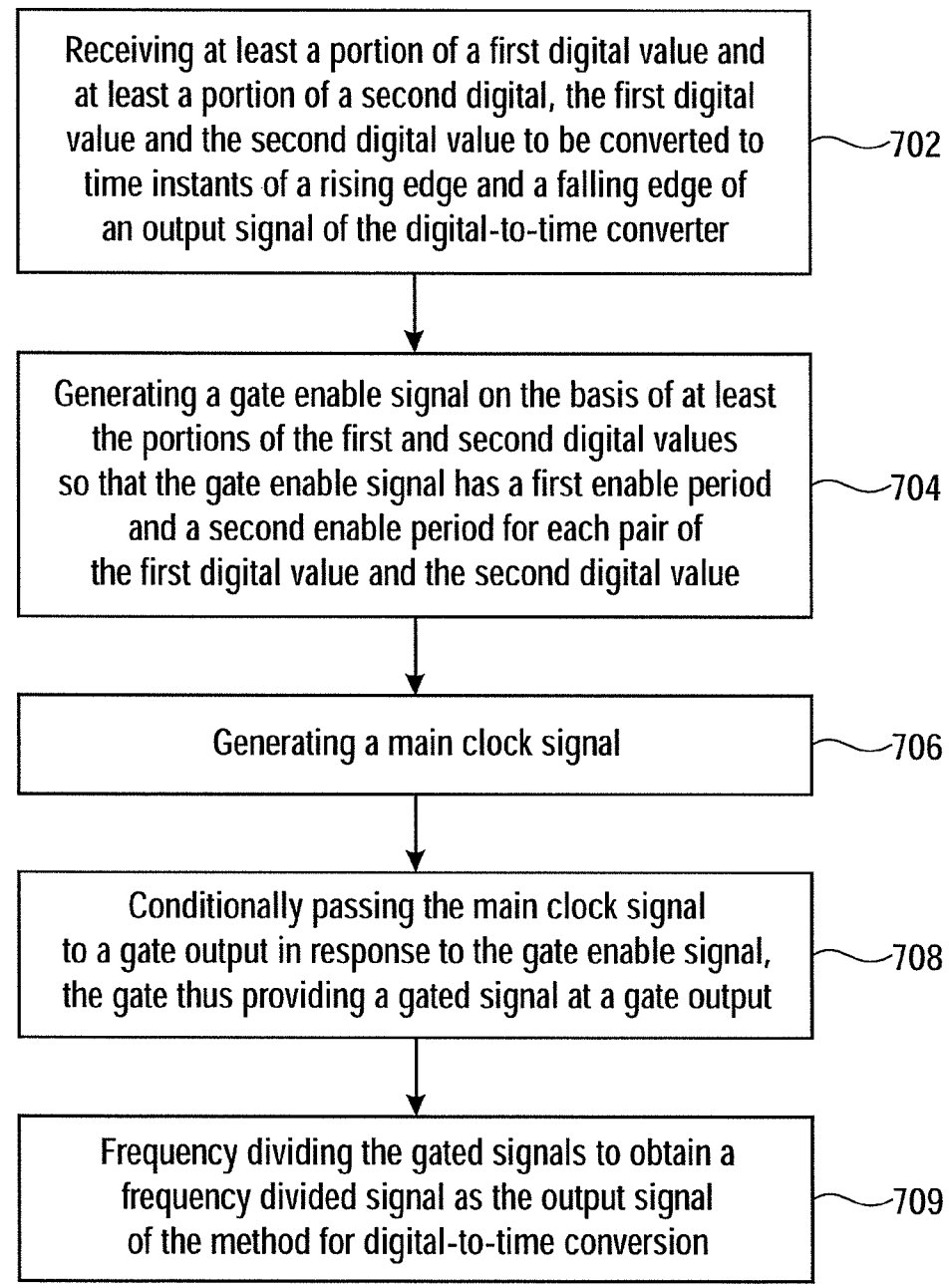
FIG. 7 schematically illustrates a flow diagram of an exemplary method for digital-to-time conversion.

FIG. 7 schematically illustrates a flow diagram of an exemplary method for digital-to-time conversion. The method comprises a step 702 of receiving at least a portion of a first digital value and at least a portion of a second digital value. The first digital value and the second digital value are be converted to time instants of a rising edge and a falling edge, respectively, of an output signal of the method for digital-to-time conversion. A gate enable signal is generated during a step 704 based on at least the portions of the first and second digital values so that the gate enable signal has a first enable period and a second enable period for each pair of the first digital value and the second digital value. The method further comprises a step 706 of generating a main clock signal and a step 708 of conditionally passing the main clock signal to a gate output in response to the gate enable signal, the gate thus providing a gated signal. The gated signal is frequency divided at a step 709 to obtain a frequency divided signal as the output signal of the method for digital-to-time conversion.

Figure 8:
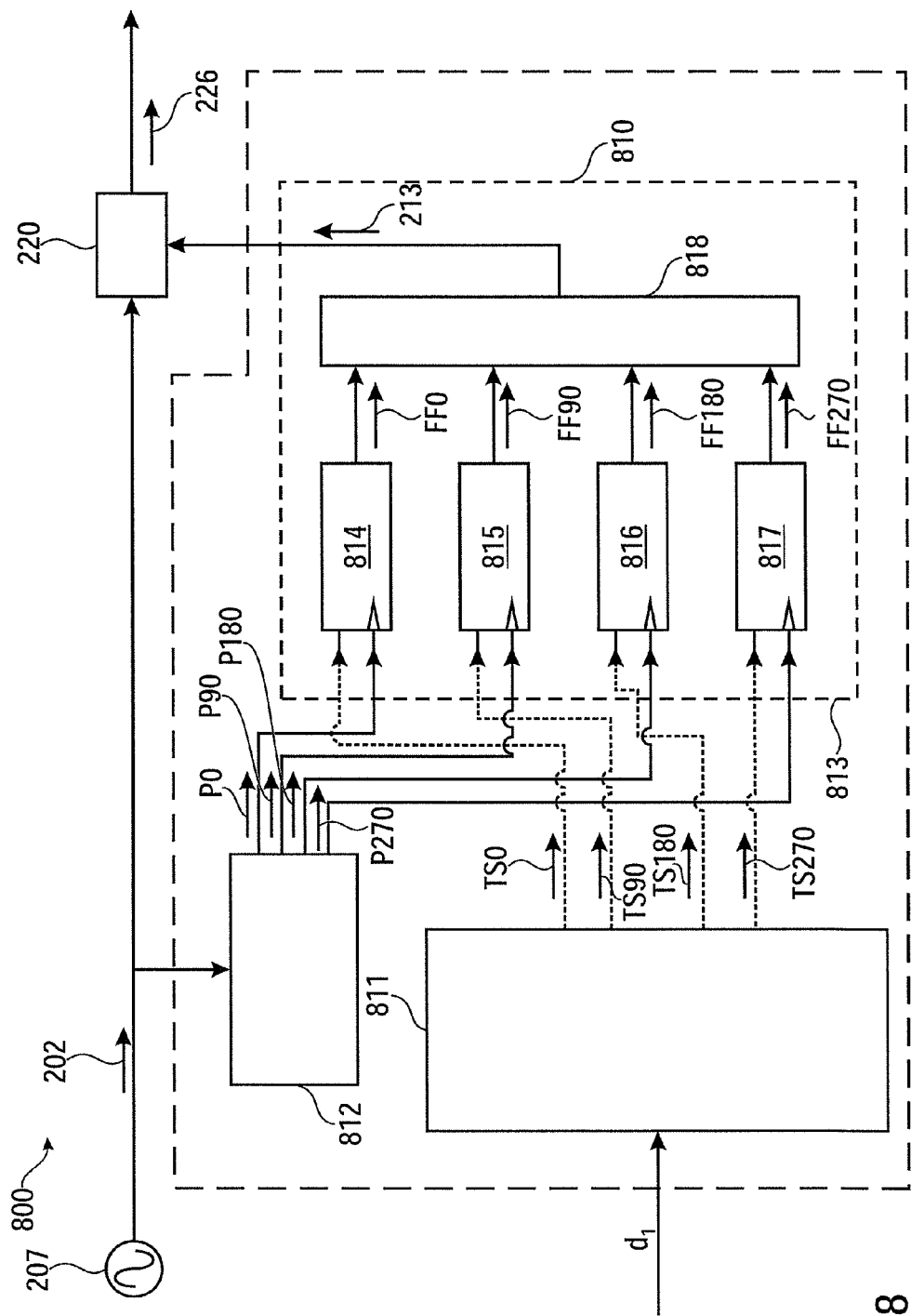
FIG. 8 shows a schematic block diagram of another exemplary digital-to-time converter with time-interleaved manner gate enable signal generation.

FIG. 8 shows a schematic block diagram of another exemplary digital-to-time converter 800 in which the gate enable signal is generated in a time-interleaved manner. The DTC 800 comprises a gate 220 configured to conditionally pass a main clock signal 202 applied at a gate input to a gate output in response to a gate enable signal 213, the gate thus providing a gated signal 226 as an output signal or an intermediate signal of the digital-to-time converter 800. The DTC 800 also comprises a gate controller 810 configured to generate the gate enable signal 213. The gate controller 810 comprises a plurality of time-interlaced flip-flops 814, 815, 816, 817. Each flip-flop 814 to 817 is configured to receive one of a plurality of time-interlaced clock signals P0, P90, P180, and P270. Each flip-flop 814 to 817 is also configured to receive one of a plurality of time slot signals TS0, TS90, TS180, TS270 representing at least a coarse portion of a digital value to be digital-to-time converted. Each flip-flop 814 to 817 is further configured to set a flip-flop output depending on a current value of the corresponding time slot signal TS0, TS90, TS180, TS270 when an edge occurs in the corresponding time-interlaced clock signal P0, P90, P180, P270. For example, flip-flop 814 is configured and connected to receive the time-interlaced clock signal P0 and the time slot signal TS0. At every rising edge of the time-interlaced clock signal P0, the flip-flop 814 updates its flip-flop output so that the flip-flop output assumes the current state of the flip-flop input. The other flip-flops 815 to 817 behave in a corresponding manner.

The gate controller 810 further comprises a signal combiner 818 configured to combine the flip-flop outputs of the plurality of flip-flops 814 to 817 to provide the gate enable signal 213. For example, the signal combiner 818 may comprise a logical OR gate. The plurality of flip-flops 814 to 817 and the signal combiner 818 form time-interleaved enable signal generator 813.

The time-interlaced clock signals are generated by a time-interlaced clock divider 812 based on the main clock signal 202. For example, the time-interlaced clock divider 812 may be an IQ divider with a frequency division factor 4. The phase matching requirements for the time-interlaced clock divider 812 do not have to be very strong because within the gate controller 810 a relatively coarse precision is sufficient. The reason is that it is sufficient to provide the gate enable signal 213 to the gate 220 sufficiently in advance to the occurrence of the desired rising edge in the main clock signal 202 but without a precise timing, because anyway the gate 220 uses the main clock signal 202 for timing purposes. The time-interlaced clock signals P0, P90, P180, P270 may be uniformly phase-shifted to each other by 90 degrees (more generally: by 360/n degrees, where n is the number of time-interlaced clock signals). For example, the time-interlaced clock signal P0 is phase-shifted by 0 degrees, the time-interlaced clock signal P90 is phase-shifted by 90 degrees, the time-interlaced clock signal P180 is phase-shifted by 180 degrees, and the time-interlaced clock signal P270 is phase-shifted by 270 degrees. In other words, each logic circuit (e.g., AND gate) 824 to 827 of a plurality of logic circuits is configured to combine one of the flip-flop outputs FF0 to FF270 generated by a one of the flip-flops with at least one second time-interlaced clock signal P180, P270, P0, P90, wherein the considered flip-flop is controlled by a corresponding time-interlaced clock signal P0 to P270 and another flip-flop 815, 816, 817, 814 is controlled by the at least one second time-interlaced clock signal P180, P270, P0, P90. A further logic circuit such as a logic OR gate 828 is configured to combine a plurality of logic circuit outputs of the logic circuits 824 to 827 to provide the gate enable signal 213.

The decoder 811 may be configured to generate the time slot signals as mutually exclusive signals. In particular, the decoder processes the digital value $d_1$ (or the most significant portion thereof) to determine in which time slot the corresponding rising or falling edge in the output signal occurs. Depending on the determined time slot information, the decoder 811 sets the corresponding time slot signal TS0, TS90, TS180, or TS270 to the logic high state. The corresponding flip-flop (e.g., flip-flop 814) forwards the logic high state to its output as soon as a next rising edge in the corresponding time-interlaced clock signal P0 occurs.

The time-interleaved implementation of the gate enable signal generation relaxes the speed requirements for the employed logic circuits by a factor 4 in the depicted example.

Even for relatively high frequency output signals a realization is thus feasible, possibly even using standard complementary metal oxide semiconductor (CMOS) circuits. Parallelization with time interleaving enables the use of standard CMOS flip-flops. In the example a 16 GHz clock is used which means that the flip-flops are operated at 4 GHz only. The decoder 811 synchronizes the modulation data and increases the frequency gradually. The IQ divider 812 provides the clocks for the four high-speed flip-flops 814 to 817. The accuracy of the four phases is not overly critical as explained above.

FIG. 9 schematically illustrates several exemplary waveforms and an exemplary logic circuit of the time-interleaved enable signal generator 813. The waveforms show the main clock signal 202 and the four time-interleaved clock signals P0, P90, P180, P270 at a quarter of the frequency of the main clock signal 202. The time interleaved clock signals are here derived from the falling edges of the main clock. In the lower part of FIG. 9 it can be seen that the signal combiner 818 may comprise four logic AND gates 824, 825, 826, 827 and a logic OR gate 828. Each of the four logic AND gates 824 to 827 is connected to an output of one of the flip-flops 814 to 817 and also to two of the time-interlaced clock signals that correspond to two other flip-flops. For example, the logic AND gate 824 is connected to the output of flip-flop 814 and to the time-interlaced clock signals P270 (corresponding to flip-flop 817) and P180 (corresponding to flip-flop 816). The logic AND gates 824 to 827 prevent that the gate enable signal 213 is at the logic high state for too long (more than one period of the main clock signal 202) which would cause the gate 220 to pass several consecutive pulses of the main clock signal 202 during each enable period of the gate enable signal 213. Note that rising edges in the time-interlaced clock signals P0, P90, P180, P270 are triggered by falling edges of the main clock signal 202, i.e., the time-interlaced clock divider 812 operates on falling edges of the main clock signal 202. The logic equations for the pulses A, B, C, and D of the main clock signal 202 are:

| A = FF0 | AND | P270 | AND | P180 |
|---|---|---|---|---|
| B = FF90 | AND | P0 | AND | P270 |
| C = FF180 | AND | P90 | AND | P0 |
| D = FF270 | AND | P180 | AND | P90. |

Figure 10:
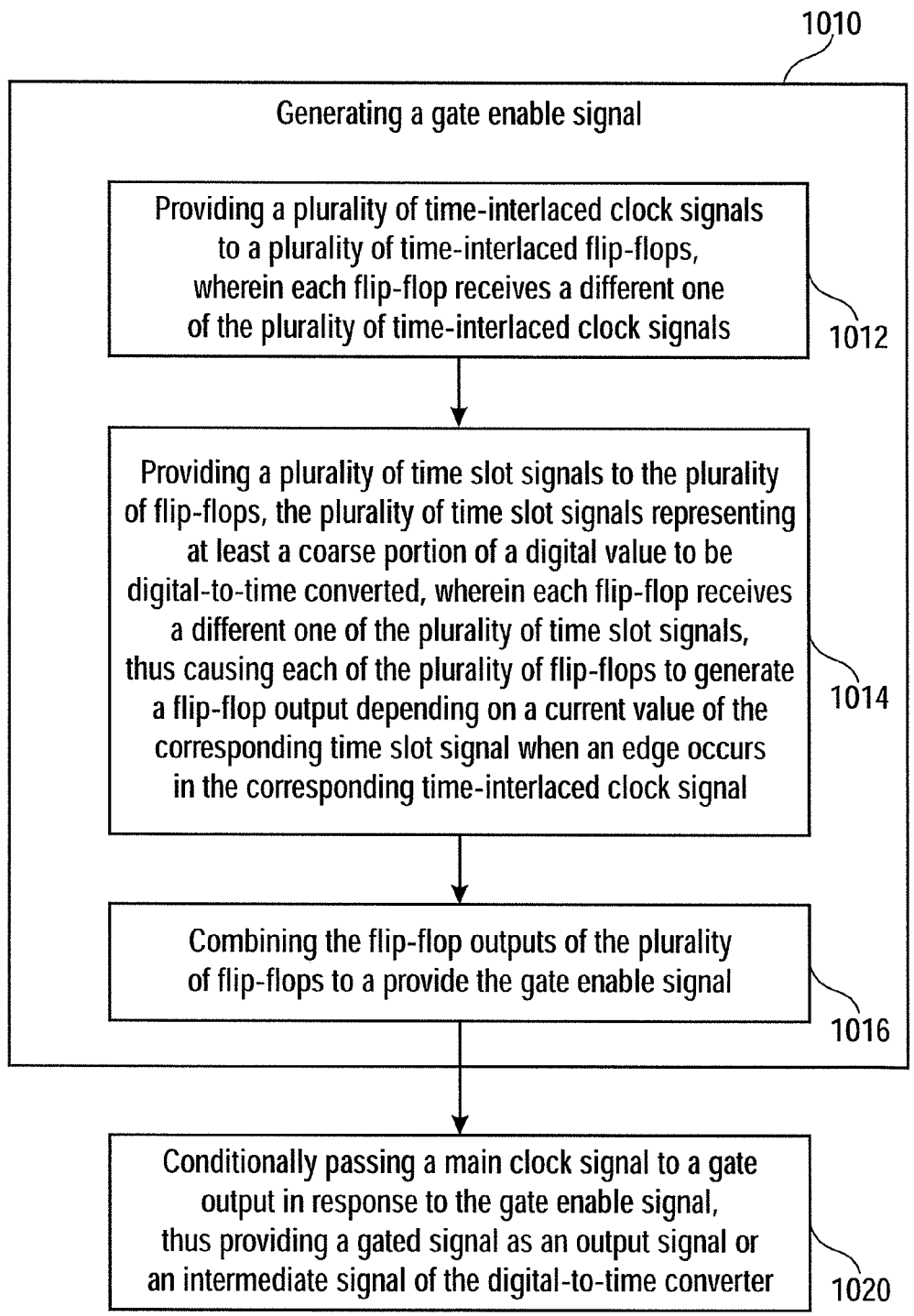
FIG. 10 shows a schematic flow diagram of a further exemplary method for digital-to-time conversion.

FIG. 10 shows a schematic flow diagram of a further exemplary method for digital-to-time conversion. A main clock signal may be generated for example by an oscillator (not shown in FIG. 10). The method comprises the generation of a gate enable signal at a step 1010 that comprises the following sub-steps:

at a sub-step 1012, the method provides a plurality of time-interlaced clock signals P0 to P270 to a plurality of time-interlaced flip-flops: Each flip-flop 824 to 827 receives a different one of the plurality of time-interlaced clock signals P0 to P270.

at a sub-step 1014, the method provides a plurality of time slot signals IS0 to TS270 to the plurality of flip-flops: The plurality of time slot signals TS0 to TS270 represents at least a coarse portion of a digital value $d_1$ to be digital-to-time converted. Each flip-flop receives a different one of the plurality of time slot signals, thus causing each of the plurality of flip-flops to generate a flip-flop output FF0 to FF270 depending on a current value of the corresponding time slot signal TS0 to TS270 when an edge occurs in the corresponding time-interlaced clock signal P0 to P270; and at a sub-step 1016, the method combines the flip-flop outputs of the plurality of flip-flops to a provide the gate enable signal.

The method further comprises a step 1020 of conditionally passing, e.g. using a gate, the main clock signal 202 to a gate output in response to a gate enable signal 213, thus providing a gated signal 226 as an output signal or an intermediate signal of the digital-to-time converter.

Figure 11A:
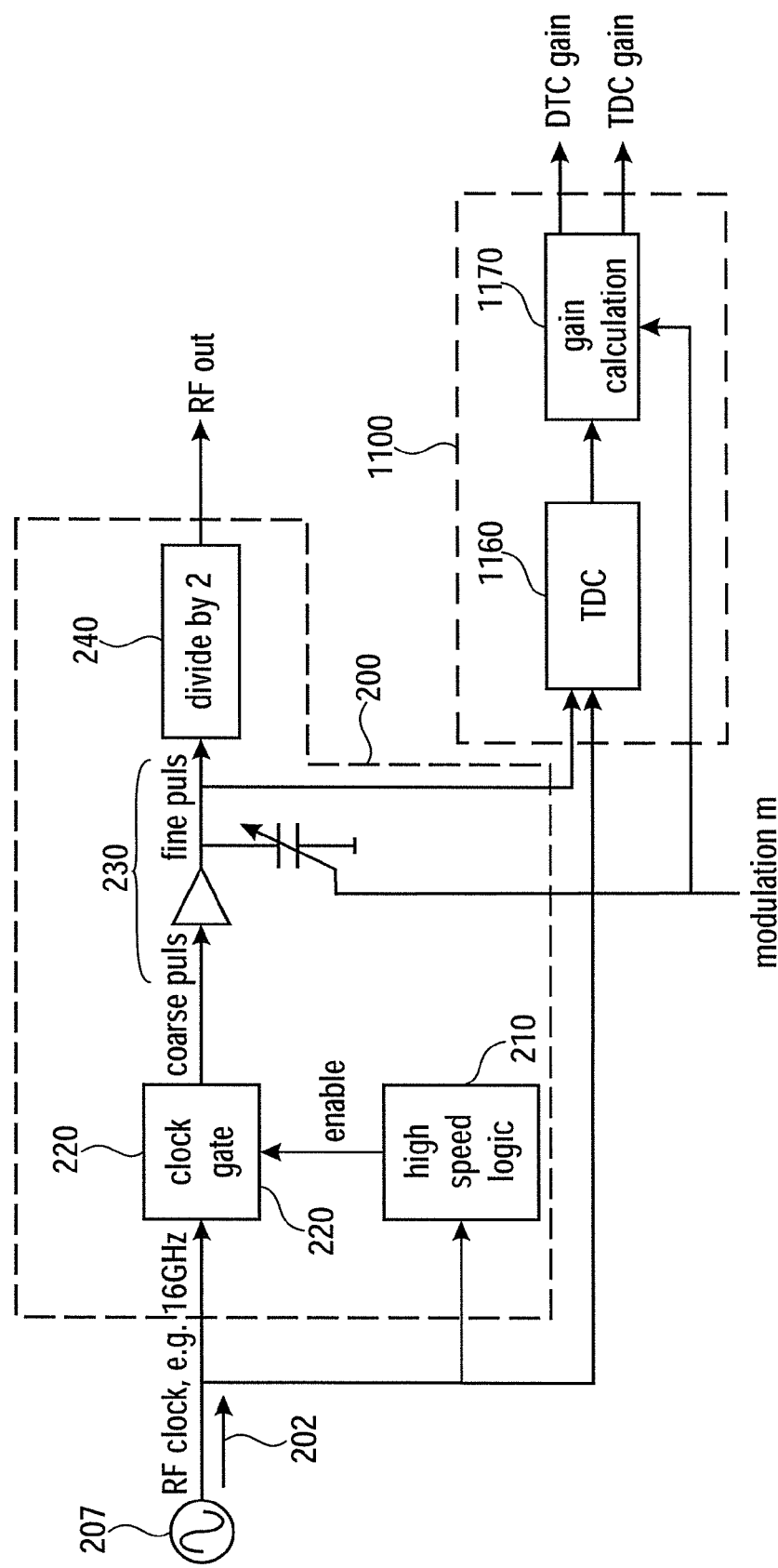
FIG. 11A shows a schematic block diagram of a DTC and a calibrator for calibrating the DTC.

FIG. 11A shows a schematic block diagram of a DTC 200 and a calibrator 1100 for calibrating the DTC 200, in particular for calibrating the fine phase modulation circuit 230 of the DTC 200.

One could calibrate the DTC 200 in a dedicated calibration phase where every possible input word is applied, the DTC output is fed back to its input, and the resulting frequency is measured. Based on this measurement a calibration table could be calculated (offline). Unfortunately, however, such a dedicated calibration phase requires significant effort for tuning all possible DTC settings. Further, as the calibration is not running in background, a continuous tracking of the fine DTC gain is not possible. The feedback also introduces also slightly different operating conditions than during a normal operating mode of the DTC.

Therefore, in some instances the calibrator 1100 schematically shown in FIG. 11A can be configured to be used during operation of the DTC 200. The calibrator 1100 comprises a time-to-digital converter (TDC) 1160 that is coupled to the DTC 200. The single shot resolution of this TDC 1160 can be lower than the DTC resolution. The RF clock 202 is starting the TDC measurement and the output of the fine delay element 230 is stopping the measurement. Thus the TDC 1160 measures the fine delay plus an offset of the clock gate 220 and the TDC offset itself. In one possible implementation a single TDC 1160 captures two rising edges of the RF clock 202. As the RF clock is very high, e.g. 16 GHz, this is not a big deal, i.e., the TDC 1160 may have a relatively small measuring range. In case the TDC 1160 is employs a delay line, a relatively short length of this delay line is sufficient due to the short maximal measuring period equal to one period of the RF clock 202.

The TDC measurement result is fed to a gain calculation block 1170 where both the TDC gain and the DTC gain are calculated. This result of the gain calculation block is the desired gain of the fine delay stage 230. The calibration approach is fully capable for background calibration, thus variations of operating conditions can be tracked online. To keep the additional power consumption under control, the measurement rate of the TDC can be limited, e.g. not every event is measured but 1 out of N events is measured. The concept for DTC calibration proposes that the DTC 200 with coarse and fine delay tuning comprises (or is coupled to) a TDC 1160 coupled around the fine delay tuning element 230 of the DTC 200. The TDC 1160 is continuously measuring the fine delay and is calculating the fine DTC gain iteratively, i.e. not from a single measurement but by averaging of many measurement results acquired in background.

In other words, the calibrator 1100 comprises the time-to-digital converter (TDC) 1160 and the gain calculator 1170. A first input of the time-to-digital converter 1160 is connected to a reference clock input (or alternatively to the gated reference clock) of the DTC 200. Another input of the TDC 1160 is connected to an output of a delay element or delay path of the DTC 200. In the depicted example of FIG. 11A the delay element comprises the fine phase modulation circuit 230. The time-to-digital converter 1160 is configured to determine a duration value for a time interval between an edge of a reference clock signal and a resulting output event at the output of the delay element.

The gain calculator 1170 is configured to determine a gain of the digital-to-time converter 200 based on the duration value and a current tuning value (modulation m) applied to the digital-to-time converter 200 for controlling the digital-to-time converter 200. The tuning value m adjusts the fine phase modulation circuit 230.

Figure 11B:
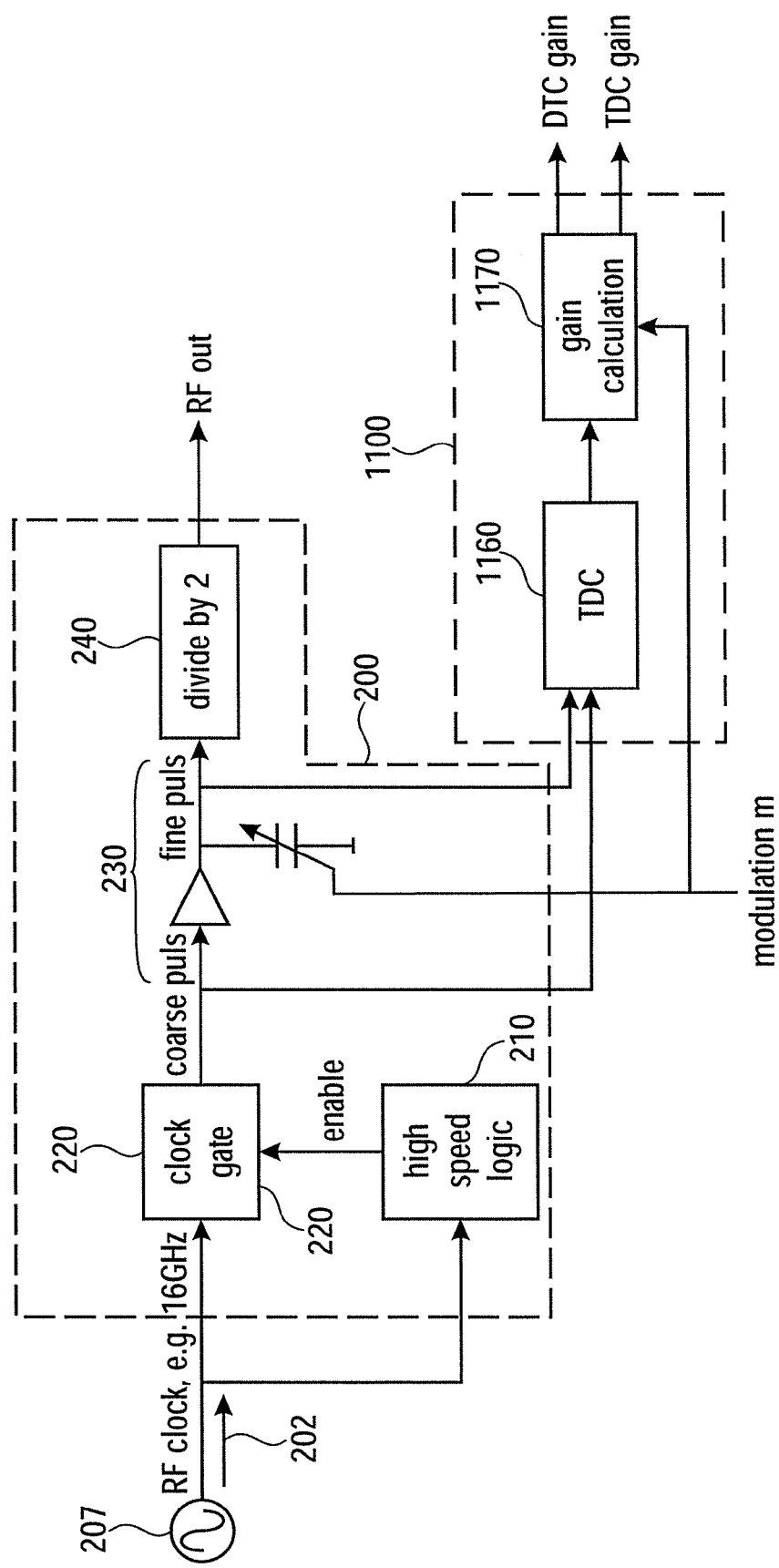
FIG. 11B shows a schematic block diagram of a DTC using double pulses per enable period.

FIG. 11B shows a schematic block diagram of a DTC 200 and a calibrator 1100 according to another exemplary implementation. Differing from FIG. 11A the TDC 1160 of the calibrator 1100 is connected to the output of the gate 220 instead of to its input. In this manner, the TDC 1160 only receives those pulses of the reference clock signal 202 that have been passed by the gate 220. The other input of the TDC 1160 is connected to the output of the fine delay element 230, as in the exemplary implementation of FIG. 11A. The implementation of the calibrator 1100 according to FIG. 11B is configured to analyze double pulses output by the gate 220 as described above in connection with FIGS. 3B and 4B.

Figure 12:
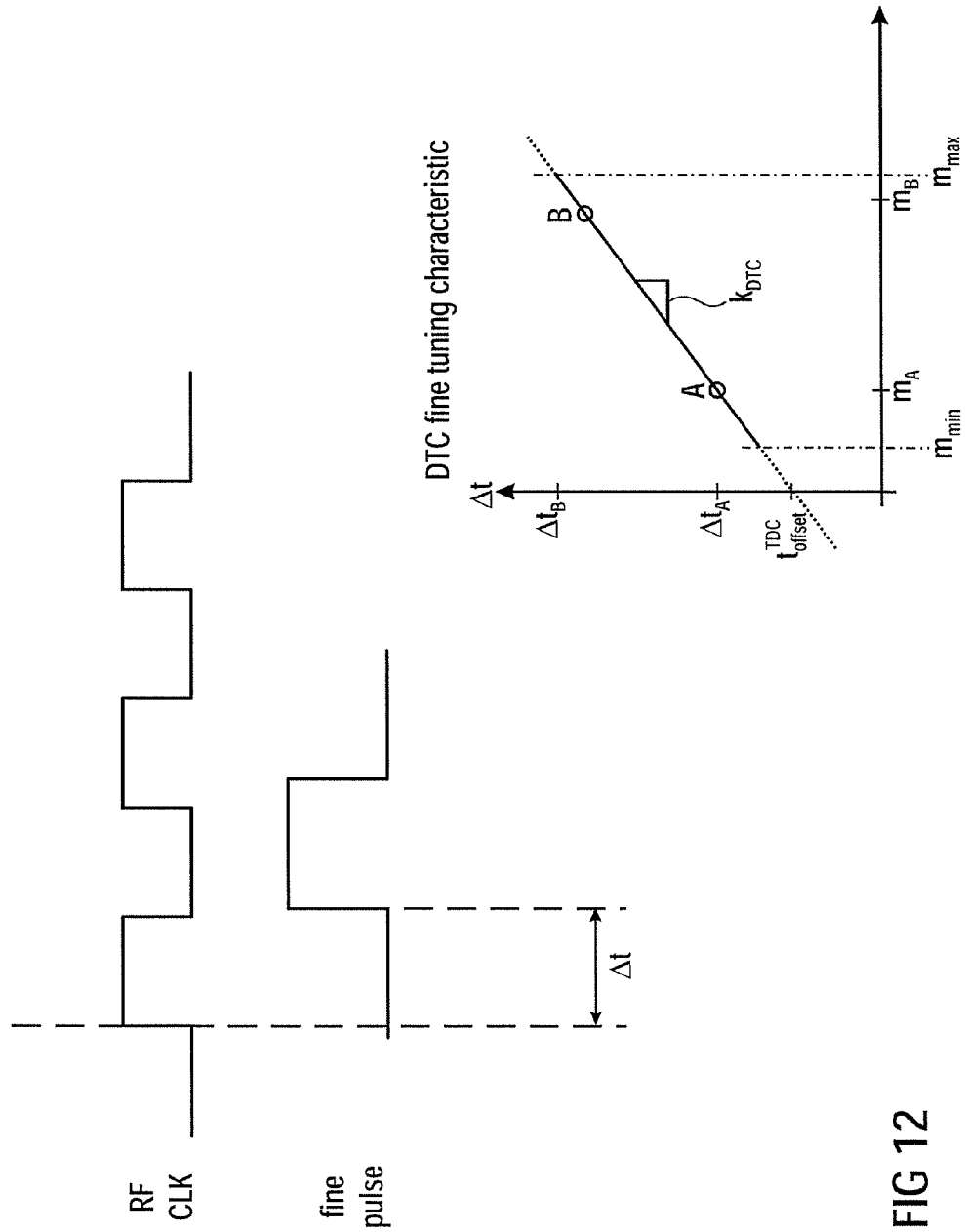
FIG. 12 schematically illustrates a two-point measuring principle used in an exemplary implementation of the calibrator.

FIG. 12 schematically illustrates in the upper part the waveforms of the RF clock 202 and of the fine pulse, i.e., the output of the fine phase modulation circuit 230. The rising edge of the fine pulse is delayed with respect to the rising edge of the RF clock by the time interval $\Delta t$. The lower part of FIG. 12 schematically illustrates a fine tuning characteristic of the fine phase modulation circuit 230. The fine tuning characteristic is assumed to be linear with a slope $k_{DTC}$ and an offset $t_{offset}^{DTC}$. One option for determining the parameters $k_{DTC}$ and $t_{offset}^{DTC}$ is to perform a two-point measurement at two different operating points A and B of the DTC. At the operating point A, a modulation value $m_A$ is applied to the fine phase modulation circuit 230 resulting in a fine delay of $\Delta t_A$. At the operating point B, a modulation value $m_B$ is applied to the fine phase modulation circuit 230 resulting in a fine delay of $\Delta t_B$. The TDC 1160 outputs a duration value s with $$s = (\Delta t + t_{offset}^{TDC}) k_{TDC} + e$$

where e is a quantization error of the TDC 1160. The two-point formulas for the DTC fine tuning characteristic are:

$$k_{DTC} = \frac{\Delta t_A - \Delta t_B}{m_A - m_B}$$

$$t_{offset}^{DTC} = \Delta t_A - m_A k_{DTC}$$

The true durations of the time intervals $\Delta t_A$ and $\Delta t_B$ are not directly measurable but can be expressed as functions of the duration values $s_A$ and $s_B$ output by the TDC 1160. Therefore, the DTC gain $k_{DTC}$ can be obtained by evaluating $$k_{DTC} = \frac{\frac{1}{k_{TDC}}(s_A - e_A - s_B + e_B) - t_{offset}^{TDC} + t_{offset}^{TDC}}{m_A - m_B}$$

$$= \frac{s_A - e_A - s_B + e_B}{k_{TDC}(m_A - m_B)}$$

Ideally, the quantization errors $e_A$ and $e_B$ would negligible, which may be assumed of the resolution of the TDC 1160 is sufficiently high so that $$k_{DTC} = \frac{s_A - s_B}{k_{TDC}(m_A - m_B)}$$

The offset $t_{offset}^{DTC}$ of the DTC 200 may now be determined by $$t_{offset}^{DTC} = \frac{1}{k_{TDC}}(s_A - e_A) - t_{offset}^{TDC} - m_A \cdot k_{DTC}$$

Note that the gain $k_{TDC}$ and the offset $t_{offset}^{TDC}$ of the TDC 1160 are known when this approach using a two-point evaluation is used. The two-point approach may be extended by performing several measurements at different operating points and a least mean square evaluation or linear regression.

Figure 13:
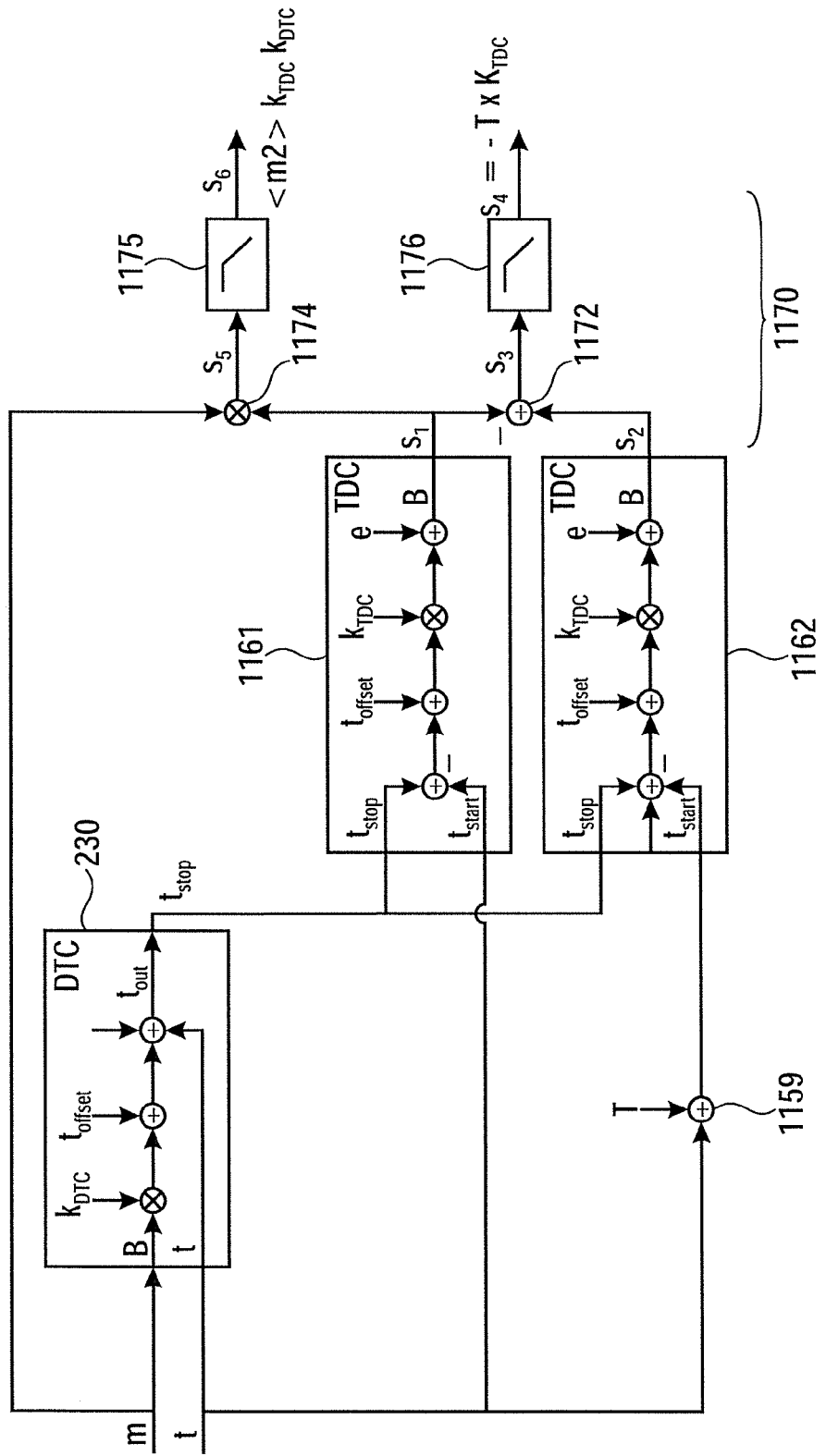
FIG. 13 schematically shows an implementation example of the gain calculation block of the calibrator.

Referring now to FIG. 13, a concept will be described in which a-priori knowledge of the gain $k_{TDC}$ and the offset $t_{offset}^{TDC}$ of the TDC 1160 is not needed. The underlying concept is that a background calibration can be performed by statistically evaluating a relatively large number of measurements of the DTC 200 in different operating conditions, wherein the measurements are performed by the TDC 1160. By exploiting the fact that the gain $k_{TDC}$ and the offset $t_{offset}^{TDC}$ of the TDC 1160 are typically sufficiently constant over a certain time interval, it is possible to perform calculations in which these parameters cancel out, or at least their influence on the determination of the final calibration result is sufficiently reduced. For example, methods of statistical processing such as low-pass filtering, averaging, and evaluations of second-order or higher-order statistical moments can be used. For example, at least one of the gain of the tunable delay element 230 and a gain of the of time-to-digital converter 1160 may be calculated based on a statistical evaluation of one or more time duration measurements.

FIG. 13 schematically shows an implementation example of the gain calculation block 1170 that makes use of a statistical analysis. The boxes illustrate linear models of the TDC 1160 and the fine DTC stage 230, respectively. Two TDC blocks 1161, 1162 are shown as two edges of the incoming clock signal are used. However, this is for explanation purposes only. The actual implementation may contain a single TDC only that is capable of determining the durations of consecutive time intervals. In FIG. 13 the upper TDC 1161 measures the duration value $s_1$ of the time interval between the first rising edge of the RF clock 202 and the subsequent rising edge of the fine pulse output by the fine phase modulation circuit 230. The lower TDC 1162 measures the duration value $s_2$ of the time interval between the fine pulse and the subsequent rising edge of the RF clock 202, as indicated by the adder 1159 where the period T of the RF clock 202 is added to the time t of the first rising edge in the RF clock 202.

The TDC gain $k_{TDC}$ can be determined by subtracting the measurement results (duration values $s_1$ and $s_2$) for the measurement of the two clock edges followed by averaging/low-pass filtering. This is schematically illustrated in FIG. 13 by the subtractor 1172 and the low pass filter 1176.

The DTC gain $k_{DTC}$ is determined by correlating the fine modulation information m with the TDC measurement results. This is schematically illustrated in FIG. 13 by the multiplier 1174 and the low pass filter 1175.

For the TDC 1160 any standard TDC, e.g. a delay line based TDC can be used. As the gain calculation is done by low pass filtering a relatively coarse quantization can be used.

The following calculation illustrate how the DTC gain $k_{DTC}$ can be determined using the structure of FIG. 13.

$$t_{stop} = t + t_{offset}^{DTC} + k_{DTC} \cdot m$$

$$s_1 = (t_{stop} - t + t_{offset}^{TDC}) k_{TDC} + e_1$$

$$s_2 = (t_{stop} - T - t + t_{offset}^{TDC}) k_{TDC} + e_2$$

$$s_3 = s_2 - s_1 = -T \cdot k_{TDC} + e_2 - e_1$$

$$s_4 = -T \cdot k_{TDC} \Rightarrow k_{TDC} = -\frac{1}{T} s_4 \text{ TDC gain}$$

$$s_5 = m \cdot s_1$$

$$= m[k_{TDC}(t + t_{offset}^{DTC} + k_{DTC} \cdot m - t + t_{offset}^{TDC}) + e_1]$$

-continued $$s_6 = \langle s_5 \rangle$$
$$= \langle m^2 \rangle \cdot k_{TDC} \cdot k_{DTC} \Rightarrow k_{DTC}$$
$$= \frac{s_6}{\langle m^2 \rangle \cdot k_{TDC}} DTC \text{ gain}$$

The parameter T is the known RF clock period and m is the fine delay modulation. It is assumed that the expectation value of m is zero, i.e. <m>=0. The variance <m²> can be estimated based on previous measurements of m.

Figure 14:
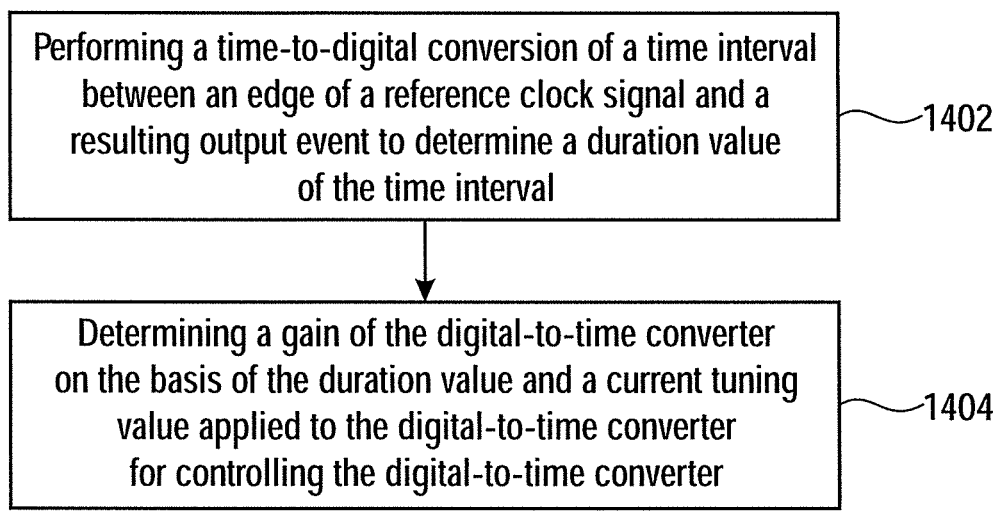
FIG. 14 shows a schematic flow diagram of a method for calibrating a digital-to-time converter.

FIG. 14 shows a schematic flow diagram of a method for calibrating a digital-to-time converter and in particular for calibrating the fine phase modulation circuit 230 of the DTC 200. At a step 1402 a time-to-digital conversion of a time interval between an edge of a reference clock signal 202 and a resulting output event (e.g., a subsequent rising edge of the fine delayed signal) is performed to determine a duration value $s_1$ of the time interval $\Delta t$. The method further comprises a step 1404 of determining a gain $k_{DTC}$ of the digital-to-time converter (or a gain of the delay element within the DTC 200) based on the duration value $s_1$ and a current tuning value m applied to the DTC 200 for controlling the digital-to-time converter 200.

With respect to possible applications of the digital-to-time converter 200 and its calibration, the digital-to-time converter 200 may be used in a mobile communication device. Accordingly, a digital-to-time converter comprises a digital-to-time converter that comprises: a gate configured to conditionally pass a main clock signal applied to a gate input to a gate output in response to a gate enable signal, the gate thus providing a gated signal as an output signal or an intermediate signal of the digital-to-time converter; and a gate controller configured to generate the gate enable signal. The gate controller comprises a plurality of time-interlaced flip-flops and a signal combiner. Each flip-flop is configured to receive one of a plurality of time-interlaced clock signals and one of a plurality of time slot signals representing at least a coarse portion of a digital value to be digital-to-time converted, and each flip-flop is further configured to set a flip-flop output depending on a current value of the corresponding time slot signal when an edge occurs in the corresponding time-interlaced clock signal. The signal combiner is configured to combine the flip-flop outputs of the plurality of flip-flops to provide the gate enable signal.

Another possible example is a mobile communication device comprising a digital-to-analog converter and a calibrator for a digital-to-time converter. The calibrator comprises a time-to-digital converter connected to a reference clock input and to an output of the digital-to-time converter. The time-to-digital converter is configured to determine a duration value for a time interval between an edge of a reference clock signal and a resulting output event at the output of the digital-to-time converter. The calibrator further comprises a gain calculator configured to determine a gain of the digital-to-time converter based on the duration value and a current tuning value applied to the digital-to-time converter for controlling the digital-to-time converter.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus. Some or all of the method steps may be executed by (or using) a hardware apparatus, like a microprocessor, a programmable computer or an electronic circuit. Some one or more of the most important method steps may be executed by such an apparatus.

The implementation may be in hardware or in software or may be performed using a digital storage medium, for example a floppy disk, a punch card, a tape, a DVD, a Blu-Ray, a CD, a ROM, a PROM, an EPROM, an EEPROM or a FLASH memory, having electronically readable control signals stored thereon, which cooperate (or are capable of cooperating) with a programmable computer system such that the respective method is performed. A data carrier may be provided which has electronically readable control signals, which are capable of cooperating with a programmable computer system, such that the method described herein is performed.

The implementation may also be in the form of a computer program product with a program code, the program code being operative for performing the method when the computer program product runs on a computer. The program code may be stored on a machine readable carrier.

The above described is merely illustrative, and it is understood that modifications and variations of the arrangements and the details described herein will be apparent to others skilled in the art. It is the intent, therefore, to be limited only by the scope of the impending claims and not by the specific details presented by way of description and explanation above.

What is claimed is:

1. A digital-to-time converter comprising
a gate controller configured to receive at least a portion of a first digital value and at least a portion of a second digital value, the first digital value and the second digital value to be converted to time instants of a rising edge and a falling edge of an output signal of the digital-to-time converter, and further configured to generate a gate enable signal based on at least the portions of the first and second digital values so that the gate enable signal has a first enable period and a second enable period for each pair of the first digital value and the second digital value;
a gate configured to conditionally pass a main clock signal applied to a gate input to a gate output in response to the gate enable signal, the gate thus providing a gated signal at the gate output; and
a frequency divider configured to generate a frequency divided signal as the output signal of the digital-to-time converter based on the gated signal.

2. The digital-to-time converter according to claim 1, further comprising:
a digital value splitter configured to split the first digital value into a first most significant portion and a first least significant portion and to split the second digital value into a second most significant portion and a second least significant portion, the digital value splitter further being configured to provide the first most significant portion and the second most significant portion to the gate controller; and
a fine delay element configured to receive the first least significant portion and the second least significant portion and to delay the gated signal resulting from the first enable period by a first fine delay value based on the first least significant portion and to delay the gated signal resulting from the second enable period by a second fine delay value based on the second least significant portion.

3. The digital-to-time converter according to claim 1, wherein the main clock signal is a rectangular wave and wherein the gate is configured to pass a first pulse of the rectangular wave in response to the first enable period and a second pulse in response to the second enable period.

4. The digital-to-time converter according to claim 3, wherein the gate controller is further configured to change the gate enable signal during only inter-pulse gaps of the main clock signal.

5. The digital-to-time converter according to claim 1, further comprising:
a synchronizer configured to perform a variable sample rate conversion and interpolation on a low frequency sequence of the first and second digital values and for providing a sample rate converted sequence to the gate controller based on a desired output frequency and output phase of the output signal of the digital-to-time converter.

6. The digital-to-time converter according to claim 1, wherein the frequency divider is configured to cause rising edges and falling edges in the frequency divided signal based on edges of the gated signal that have the same polarity.

7. A mobile communication device comprising a digital-to-time converter, the digital-to-time converter comprising:
a gate controller configured to receive at least a portion of a first digital value and at least a portion of a second digital value, the first digital value and the second digital value to be converted to time instants of a rising edge and a falling edge of an output signal of the digital-to-time converter, and further configured to generate a gate enable signal based on at least the portions of the first and second digital values so that the gate enable signal has a first enable period and a second enable period for each pair of the first digital value and the second digital value;
a gate configured to conditionally pass a main clock signal applied at a gate input to a gate output in response to the gate enable signal, the gate thus providing a gated signal at a gate output; and
a frequency divider configured to generate a frequency divided signal as the output signal of the digital-to-time converter based on the gated signal.

8. A method for digital-to-time conversion, the method comprising:
receiving at least a portion of a first digital value and at least a portion of a second digital value, the first digital value and the second digital value to be converted to time instants of a rising edge and a falling edge of an output signal of the method for digital-to-time conversion;
generating a gate enable signal based on at least the portions of the first and second digital values so that the gate enable signal has a first enable period and a second enable period for each pair of the first digital value and the second digital value;
generating a main clock signal;
conditionally passing the main clock signal to a gate output in response to the gate enable signal, the gate thus providing a gated signal at a gate output; and
frequency dividing the gated signal to obtain a frequency divided signal as the output signal of the method for digital-to-time conversion.

9. A digital-to-time converter comprising:
a gate configured to conditionally pass a main clock signal applied at a gate input to a gate output in response to a gate enable signal, the gate thus providing a gated signal as an output signal or an intermediate signal of the digital-to-time converter; and
a gate controller configured to generate the gate enable signal and comprising:
a plurality of time-interlaced flip-flops, each flip-flop configured to receive one of a plurality of time-interlaced clock signals and one of a plurality of time slot signals representing at least a coarse portion of a digital value to be digital-to-time converted, and each flip-flop being further configured to set a flip-flop output depending on a current value of the corresponding time slot signal when an edge occurs in the corresponding time-interlaced clock signal; and
a signal combiner configured to combine the flip-flop outputs of the plurality of flip-flops to a provide the gate enable signal.

10. The digital-to-time converter according to claim 9, wherein the gate controller further comprises:
a decoder configured to decode at least the coarse portion of the digital value into the plurality of time slot signals; and
a time-interlaced clock divider configured to frequency divide a main clock signal and to generate the plurality of time-interlaced clock signals.

11. The digital-to-time converter according to claim 9, wherein the plurality of time slot signals are mutually exclusive.

12. The digital-to-time converter according to claim 9, wherein the signal combiner comprises:
a plurality of logic circuits, each logic circuit being configured to combine one of the flip-flop outputs generated by a first flip-flop with at least one second time-interlaced clock signal, wherein the first flip-flop is controlled by a first time-interlaced clock signal and a second flip-flop is controlled by the second time-interlaced clock signal; and
a further logic circuit configured to combine a plurality of logic circuit outputs to provide the gate enable signal.

13. The digital-to-time converter according to claim 9, wherein the gate controller is further configured to change the gate enable signal during only inter-pulse gaps of the main clock signal.

14. The digital-to-time converter according to claim 9, further comprising:
a synchronizer configured to perform a variable sample rate conversion on a sequence of digital values and for providing a sample rate converted sequence to the gate controller based on a desired output frequency of the output signal of the digital-to-time converter.

15. The digital-to-time converter according to claim 14, wherein the synchronizer is configured to receive a low frequency sequence of digital values and to perform interpolation as part of the sample rate conversion.

* * * * *